(12) United States Patent
Michel

(10) Patent No.: US 11,644,367 B2
(45) Date of Patent: May 9, 2023

(54) TEMPERATURE SENSOR SEMICONDUCTOR DEVICE WITH PAIR OF DIODES AND FEEDBACK LOOP

(71) Applicant: Sciosense B.V., AE Eindhoven (NL)

(72) Inventor: Fridolin Michel, Rapperswil (CH)

(73) Assignee: SCIOSENSE B.V., AE Eindhoven (NL)

( * ) Notice: Subject to any disclaimer, the term of this patent is extended or adjusted under 35 U.S.C. 154(b) by 353 days.

(21) Appl. No.: 15/734,176

(22) PCT Filed: Jun. 3, 2019

(86) PCT No.: PCT/EP2019/064324
§ 371 (c)(1),
(2) Date: Dec. 1, 2020

(87) PCT Pub. No.: WO2020/001923
PCT Pub. Date: Jan. 2, 2020

(65) Prior Publication Data
US 2021/0164843 A1 Jun. 3, 2021

(30) Foreign Application Priority Data
Jun. 29, 2018 (EP) .................................... 18180905

(51) Int. Cl.
*G01K 7/01* (2006.01)
*H03M 1/06* (2006.01)
*H03M 1/08* (2006.01)

(52) U.S. Cl.
CPC ............ *G01K 7/01* (2013.01); *H03M 1/0607* (2013.01); *H03M 1/089* (2013.01)

(58) Field of Classification Search
CPC .. G01K 7/00; G01K 7/01; G01K 7/10; G01K 7/16; G01K 7/18; G01K 7/183; H03M 1/06; H03M 1/089

(Continued)

(56) References Cited

U.S. PATENT DOCUMENTS 6,851,849 B2  2/2005  Kimura
9,031,103 B2  5/2015  Castillo et al.
(Continued)

FOREIGN PATENT DOCUMENTS

CN  102313610 A  1/2012
CN  104390715 A  3/2015
(Continued)

OTHER PUBLICATIONS

C. Lu, et al., "An 8b Subthreshold Hybrid Thermal Sensor with ±1.07° C. Inaccuracy and Single-Element Remote-Sensing Technique in 22nm FinFET," ISSCC 2018/Session, 9/Sensors and Interfaces/ 19.1, Feb. 14, 2018, 2 pages.
(Continued)

*Primary Examiner* — Hai L Nguyen
(74) *Attorney, Agent, or Firm* — Slater Matsil, LLP

(57) ABSTRACT

In an embodiment a semiconductor device includes a first diode and a second diode of specified sizing or biasing ratio, a negative voltage supply, a first resistor for a proportional to absolute temperature (PTAT) voltage drop, wherein the first diode is connected between the negative supply voltage and the first resistor, an array of dynamically matched current sources employing a dynamic element matching controller, wherein the first resistor is connected between the first diode and a first input of the array, and wherein the second diode is connected between the negative supply voltage and a second input of the array and a successive approximation register (SAR) feedback loop configured to drive a voltage difference to zero, wherein the voltage difference occurs between a first node present between the first resistor and the first input of the array and a second node present between the second diode and the second input of the array.

17 Claims, 6 Drawing Sheets

(58) Field of Classification Search
USPC .................................................. 327/512, 513
See application file for complete search history.

(56) References Cited

U.S. PATENT DOCUMENTS

| | | | |
|---|---|---|---|
| 9,897,490 B2* | 2/2018 | Miyazaki | H03M 1/36 |
| 10,190,922 B2* | 1/2019 | Eberlein | G01K 7/01 |
| 2011/0200070 A1 | 8/2011 | Makinwa et al. | |
| 2015/0226614 A1 | 8/2015 | Matsumoto et al. | |
| 2016/0238464 A1 | 8/2016 | Eberlein | |
| 2018/0149526 A1 | 5/2018 | Abughazaleh et al. | |

FOREIGN PATENT DOCUMENTS

| | | |
|---|---|---|
| EP | 2295944 A2 | 3/2011 |
| EP | 2355358 A1 | 8/2011 |
| JP | 2003014547 A | 1/2003 |
| JP | 2015105852 A | 6/2015 |
| WO | 0151902 A1 | 7/2001 |
| WO | 2015084410 A1 | 6/2015 |

OTHER PUBLICATIONS

M.A.P. Pertijs, et al., "Precision Temperature Sensors in CMOS Technology," Analog Circuits And Signal Processing Series, 2006, 30 pages.

M.A.P. Pertijs, et al., "A CMOS Smart Temperature Sensor with a 3σ Inaccuracy of ±/0.1° C. From -55° C. to 125° C.," IEEE Journal of Solid-State Circuits, vol. 40, No. 12, Dec. 2005, 11 pages.

J. Robert, et al., "A Second-Order High-Resolution Incremental A/D Converter with Offset and Charge Injection Compensation," IEEE Journal of Solid-State Circuits, vol. 23, No. 3, Jun. 1988, 6 pages.

K. Souri, et al., "A 0.12 mm2 7.4 µ W Micropower Temperature Sensor With an Inaccuracy of ±0.2° C. (3σ) From -30° C. to 125° C.," IEEE Journal of Solid-State Circuits, vol. 46, No. 7, Jul. 2011, 8 pages.

* cited by examiner

TEMPERATURE SENSOR SEMICONDUCTOR DEVICE WITH PAIR OF DIODES AND FEEDBACK LOOP

This patent application is a national phase filing under section 371 of PCT/EP2019/064324, filed Jun. 3, 2019, which claims the priority of European patent application 18180905.4, filed Jun. 29, 2018, each of which is incorporated herein by reference in its entirety.

TECHNICAL FIELD

The present invention relates to a dynamically matched temperature sensor semiconductor device, especially a CMOS temperature sensor semiconductor device.

BACKGROUND

A silicon bandgap temperature sensor makes use of the fact that the forward voltage of a silicon diode, especially the base-emitter junction of a bipolar transistor, depends on temperature. The voltage difference between two pn junctions, operated at different current densities, is proportional to absolute temperature (PTAT). The voltage across a pn junction operated with a current that is generated with a PTAT voltage is complementary to absolute temperature (CTAT).

PTAT circuits using bipolar or CMOS transistors are widely used in temperature sensors. Most CMOS temperature sensors employ a parasitic pnp transistor to generate a highly linear and accurate PTAT voltage. As illustrated in FIG. 8, the PTAT voltage $V_{ptat}$ is obtained by forcing equal current or a fixed ratio of currents into a pair of bipolar transistors $bip_1$, $bip_2$ and taking the voltage difference $\Delta V_{be}=$ (kT/q)ln(N) with the Boltzmann constant k, the elementary charge q and a factor N representing the ratio of the sizes or biasing of the bipolar transistors. For a practical value of N=4 the resulting sensitivity is about 150 µV/K. Hence, in order to guarantee accuracy below 0.1K, voltages below 15 µV need to be resolved, making precision circuit techniques necessary.

The bipolar bias current is typically generated in a feedback loop by driving the voltage difference $V_{bip1}-V_{bip2}$ to zero, thus forcing the voltage drop over $R_1$ to be equal to $V_{ptat}$. Every error in detecting the voltage difference $V_{bip1}-V_{bip2}$ will directly affect $V_{ptat}$ and thus degrade the temperature readout. Consequently, the PTAT amplifier in the feedback loop must exhibit low offset, high gain and low noise. This is usually achieved by chopping as indicated in FIG. 8. Moreover, mismatch in the PMOS current sources must be eliminated by dynamic element matching (DEM). The DEM controller rotates the current sources over time, thereby making mismatch errors negligible on average.

Most CMOS temperature sensors have the PTAT generator sensing element in common, but differ in the way the analog-to-digital conversion is performed. The PTAT voltage can be converted using a switched capacitor delta-sigma analog-to-digital converter (SC ADC), while the CTAT voltage is used for internal ADC reference voltage generation. The output of the converter is $D_{out}=A\cdot[\alpha\cdot V_{ptat}/(\alpha\cdot V_{ptat}+V_{ctat})+dQ]+B=A\cdot(\alpha\cdot V_{ptat}/V_{ref}+dQ)+B$ with A and B denoting gain and offset constants and dQ the ADC quantization error. The factor $\alpha$ is a design constant, which is optimized to cancel the PTAT and CTAT components over the temperature range, thus making the denominator $V_{ref}$ independent of temperature (bandgap voltage references are based on the same principle). In a SC ADC, a is set by a capacitive ratio, which can be controlled to obtain a precision below 0.1%. As $V_{ptat}$ ideally has zero offset, constant B is close to zero, and the temperature resolution can be approximated as $\Delta T \approx T_{max}/(2^{n(bit)}-1)$ with n(bit) referring to the effective number of bits of the ADC.

The design of the ADC can be simplified using the circuit according to FIG. 9. The PTAT and CTAT voltages converted to currents are mirrored to the inputs of a current domain delta-sigma ADC employing a current integrator and a comparator. The linearity requirements for the integrator are thus relaxed, but voltage-to-current conversion is required for the PTAT and CTAT voltages, which is subjected to additional errors and increases power consumption. Moreover, the ratio of these voltages depends on the ratio of the resistors $R_1$ and $R_2$, so that a is susceptible to resistor matching, which is typically less precise than capacitor matching.

A successive approximation ADC performs a binary search through all possible quantization levels before finally converging upon a digital output for each conversion. It typically comprises an analog voltage comparator, which compares an input voltage with the output of an internal digital-to-analog converter provided with a reference voltage. The result of the comparison is output to a successive approximation register (SAR) supplying an approximate digital code of the input voltage to the digital-to-analog converter, which in turn outputs a corresponding analog voltage to the comparator.

SUMMARY

The definitions as described above also apply to the following description unless stated otherwise. In particular, the following abbreviations are used: ADC for "analog-to-digital converter", DAC for "digital-to-analog converter", PTAT for "proportional to absolute temperature", CTAT for "complementary to absolute temperature", SAR for "successive approximation register", DEM for "dynamic element matching", LSB for "least significant bit", MSB for "most significant bit", DC for "direct current", and AC for "alternating current".

The temperature sensor semiconductor device, which may especially be a CMOS device, comprises a first diode and a second diode of specified sizing or biasing ratio, a first resistor, which is provided for a PTAT voltage drop, the first diode being connected between a negative supply voltage and the first resistor, and an array of dynamically matched current sources employing a DEM controller, the first resistor being connected between the first diode and a first input of the array of dynamically matched current sources, the second diode being connected between the negative supply voltage and a second input of the array of dynamically matched current sources.

A SAR feedback loop is provided for driving a voltage difference to zero, said voltage difference occurring between a first node that is present between the first resistor and the first input of the array of dynamically matched current sources and a second node that is present between the second diode and the second input of the array of dynamically matched current sources. The SAR feedback loop comprises a SAR controller, a SAR comparator, which is optionally provided with an integrating dynamically matched preamplifier, a generator for a CTAT voltage ($V_{ctat}$), and an adjustable second resistor ($R_2$), which implements a SAR digital-to-analog converter and is configured to convert the CTAT voltage ($V_{ctat}$) into a proportional current. Clamping the CTAT voltage across the second resistor produces a CTAT current, which can be fed into the array of dynamically matched current sources to define its nominal current. The generator for the CTAT voltage is connected to the array of dynamically matched current sources to define the nominal current, thus closing the SAR feedback loop.

In an embodiment of the temperature sensor semiconductor device, the diodes are base-emitter junctions of bipolar transistors. This embodiment has the advantage of being especially suitable for production in a CMOS process.

A further embodiment comprises a chopped or auto-zeroed integrating preamplifier in front of the SAR comparator, which converts a step signal into a linear slope signal, thus averaging out DEM transients while amplifying the PTAT voltage. This embodiment has the advantage of filtering DEM ripple and boosting the PTAT voltage before comparison.

In a further embodiment the integrating preamplifier employs an open loop transconductance/capacitance stage, which may especially comprise a cascode or a folded cascode. This embodiment has the advantage of eliminating the tradeoff between noise and settling.

A further embodiment comprises a chopping amplifier in the generator for the CTAT voltage. This embodiment has the advantage that it avoids offset and flicker noise added on the CTAT voltage and thus facilitates calibration.

A further embodiment comprises a further first resistor connected between the second diode and the second input of the array of dynamically matched current sources. The first diode and the second diode are equally sized and thus form a symmetric arrangement, and an asymmetrical biasing is provided by the array of dynamically matched current sources. This embodiment has the advantage that it enables to circumvent problems caused by bipolar transistors experiencing significant flicker noise and drift.

In the operation of the further embodiment, during a first half of a DEM cycle, the first diode is biased with a current that is higher than the current of the second diode, the first resistor is shorted, and the further first resistor is connected to the SAR feedback loop, and during a second half of the DEM cycle, the second diode is biased with a current that is higher than the current of the first diode, the first resistor is connected to the SAR feedback loop, and the further first resistor is shorted.

In a further embodiment the second resistor comprises a ladder of unit resistors with Kelvin connections and a plurality of unit resistors in parallel. This embodiment has the advantage that it allows to choose the desired resistor values without introducing voltage drops across switches.

A further embodiment comprises a switch of the generator for the CTAT voltage, which enables an application of a calibration voltage of prescribed value instead of the generated CTAT voltage. This embodiment has the advantage that it allows a two-step calibration of the temperature sensor.

In particular, a SAR conversion with an application of the calibration voltage at a prescribed temperature yields a correction for spread in the ratio of a resistance of the SAR digital-to-analog converter to the first resistor, and a subsequent SAR conversion at the prescribed temperature without application of the calibration voltage yields a correction of a PTAT spread of the CTAT voltage.

The temperature sensor semiconductor device may especially be employed in a portable or connected smart home device.

Further on, the temperature sensor semiconductor device may be employed in a mobile device. The mobile device may be a smart phone, a tablet, a smart watch or wearable or another kind of mobile device.

Further on, the temperature sensor semiconductor device may be employed in a medical device.

BRIEF DESCRIPTION OF THE DRAWINGS

The following is a detailed description of examples of the semiconductor device in conjunction with the appended figures.

DETAILED DESCRIPTION OF ILLUSTRATIVE EMBODIMENTS

Figure 1:
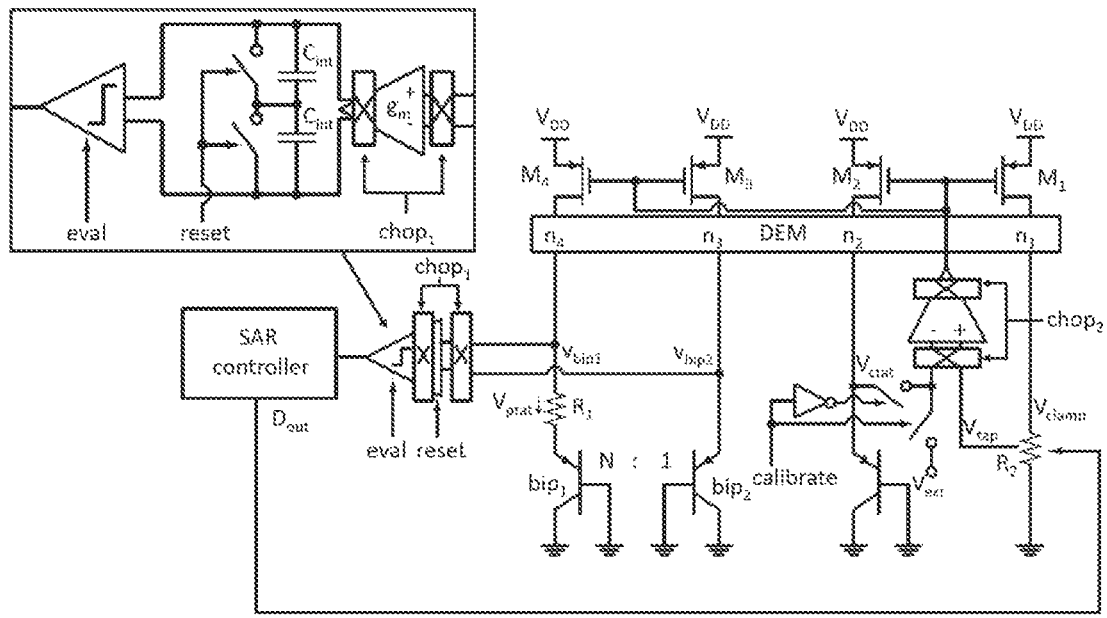
FIG. 1 is a circuit diagram of a direct SAR temperature sensor topology.
Figure 2:
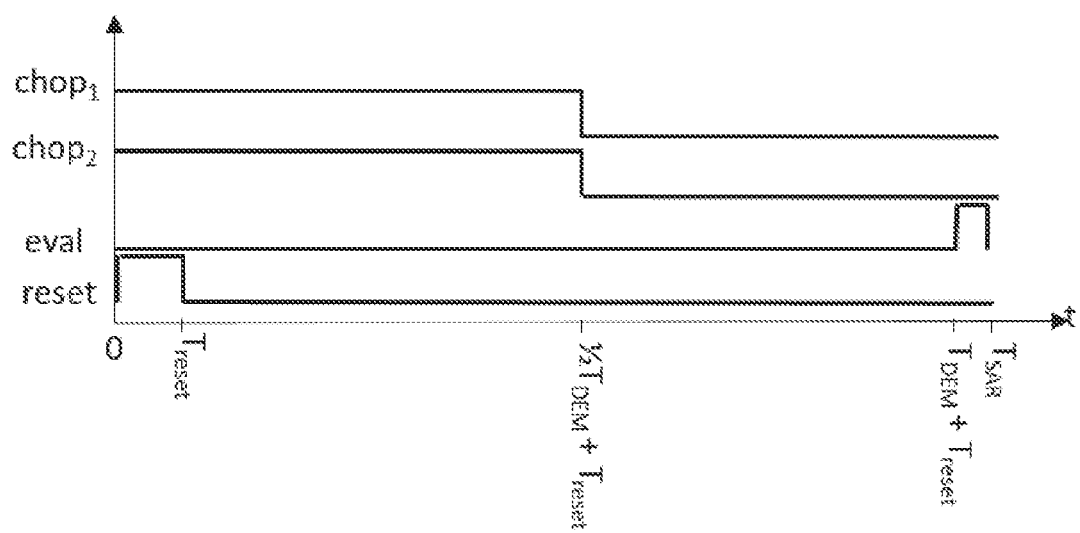
FIG. 2 is a timing diagram for the circuit according to FIG. 1.

In the temperature sensor semiconductor device the temperature sensing front end is embedded in a SAR feedback loop as illustrated in FIG. 1. A corresponding timing diagram for one SAR conversion step is shown in FIG. 2. Neither a PTAT generation amplifier nor a delta-sigma converter is applied. For ten bits (0.1K resolution) only ten SAR cycles are necessary, for example. Hence the conversion time is considerably shorter than the conversion time that can be achieved with a delta-sigma converter.

Figure 8:
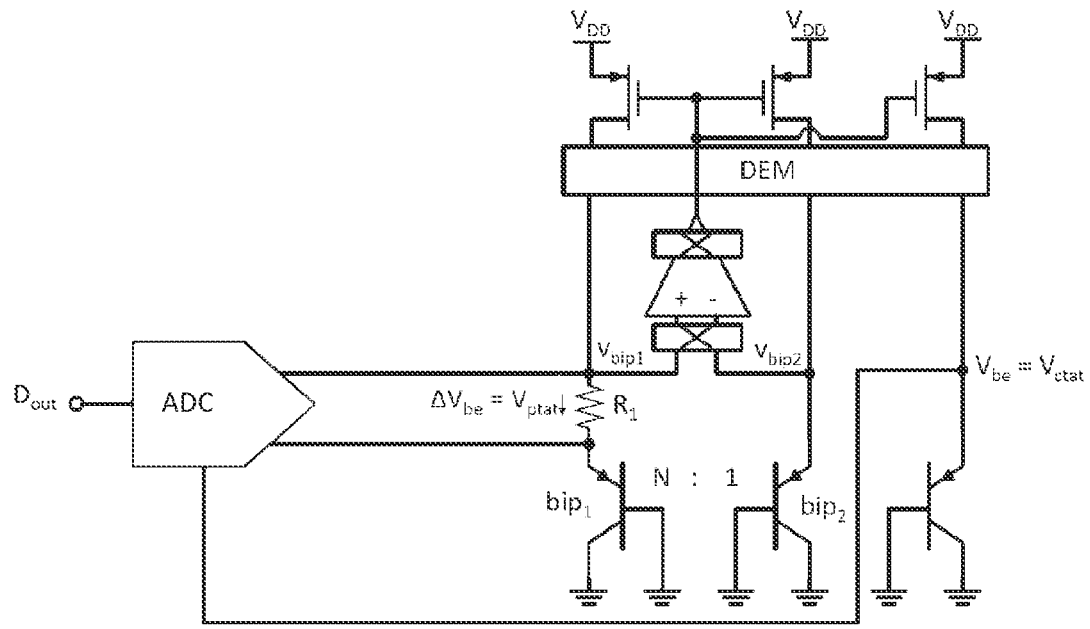
FIG. 8 is a circuit diagram of a conventional CMOS temperature sensor topology.
Figure 9:
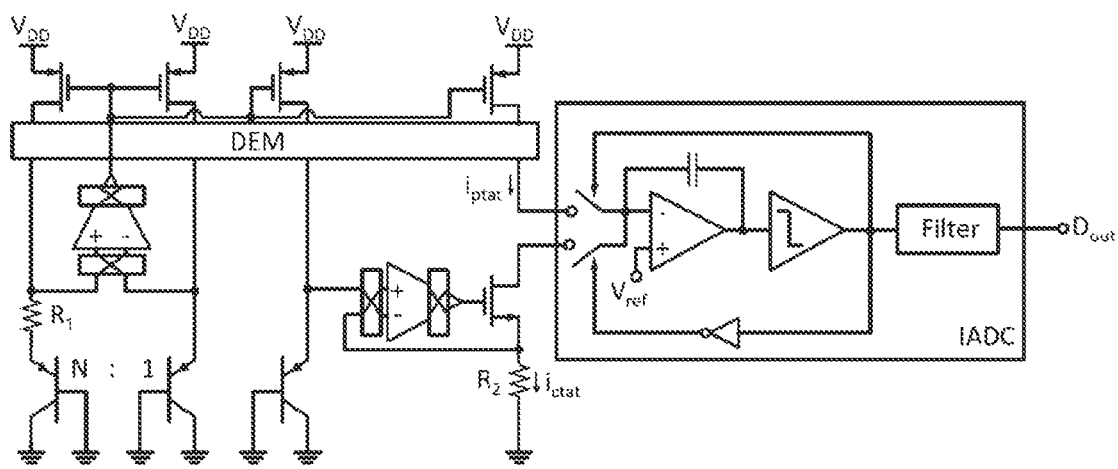
FIG. 9 a circuit diagram of a current domain CMOS temperature sensor topology.

Instead of driving the voltage $V_{bip1}-V_{bip2}$ to zero in a continuous time feedback loop, the voltage is zeroed in a SAR loop by adjusting a resistor $R_2$ in a CTAT generator. The CTAT generator comprises a continuous time feedback loop, but the design requirements are relaxed, as $V_{ctat}$ ($V_{be}$) is much larger than $\Delta V_{be}$, so that errors in clamping $V_{ctat}$ across the resistor $R_2$ will be considerably less severe than in a PTAT generator according to FIG. 8. The adjusted CTAT current is mirrored into the pair of diodes, especially the pair of bipolar transistors $bip_1$, $bip_2$, and causes a voltage drop across $R_1$ of $V_{ctat} \cdot R/R_2$. By direct comparison the voltage difference $V_{bip1}-V_{bip2}$ is driven to zero at the end of the SAR conversion, so that $V_{ptat}=V_{ctat} \cdot R_1/R_2$. This yields the ratio $V_{ctat}/V_{ptat}=(R_2+dQ)/R_1=(D_{out} \cdot R_{lsb}+dQ)/R_1$, where $dQ$ denotes the quantization error in $R_2$.

Using this ratio, the temperature $T_{readout}$ can be calculated as $$T_{readout}=A \cdot \alpha \cdot V_{ptat}/(\alpha \cdot V_{ptat}+V_{ctat})+B=A/[1+V_{ctat}/(\alpha \cdot V_{ptat})]+B \text{ or}$$

$$T_{readout}=A/[1+(D_{out} \cdot R_{lsb})/(\alpha \cdot R_1)]+B.$$

Mismatch in the PMOS current mirrors and offset in the CTAT amplifier will affect the final result. These errors could be eliminated by calibration, but the calibration would become invalid over time owing to drift in offset and mismatch. If stability of the sensor over time is a requirement, DEM is applied. As DEM converts DC mismatch and offset into AC ripple, it requires averaging typically provided by the first integrator of a delta-sigma converter. In this temperature sensor an open loop $g_m/C$ stage is employed in front of the comparator. In this way DEM ripple is filtered while $v_{ptat}$ is boosted before comparison. Amplification of $v_{ptat}$ is crucial because comparators cannot be practically designed for V accuracy.

The $g_m/C$ stage converts the DEM step signals into linear slope signals. As long as a complete DEM cycle is run before comparison, all mismatch errors are integrated equally long with positive and negative slope. As a result, DEM transients are exactly cancelled while the signal $V_{ptat}$ is amplified. For instance, assuming an input referred offset $V_{off}$ at the $g_m/C$ amplifier, then integration for one DEM cycle $T_{DEM}$ yields $$V_{out,gm}/C = 2 \cdot g_m/C_{int}(\int_0^{T_{DEM}} v_{PTAT} dt + \int_0^{T_{DEM}/2} v_{off} dt - \int_{T_{DEM}/2}^{T_{DEM}} v_{off} dt) \text{ or}$$

$$V_{out,gm}/C = 2 \cdot g_m \cdot T_{DEM} \cdot V_{ptat}/C_{int}.$$

The offset is cancelled because the input chopper chop$_1$ reverses the offset sign after half a DEM cycle.

Figure 3:
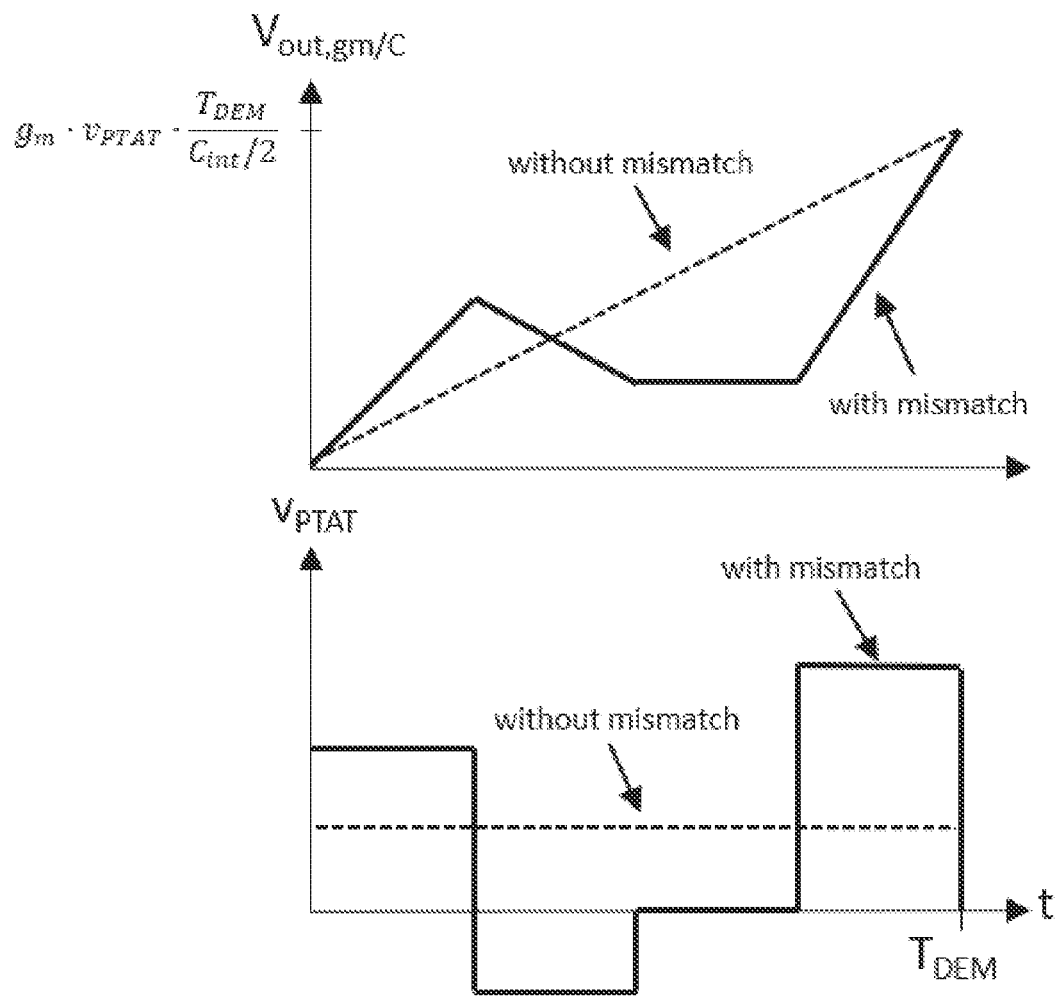
FIG. 3 shows example waveforms during one DEM cycle.

In FIG. 3 example waveforms are depicted for one DEM cycle. While the $g_m/C$ output significantly deviates from the signal during the DEM cycle, at the end of the cycle it converges to the signal only.

Compared to an integrator in a delta-sigma converter built from a feedback amplifier, the open loop $g_m/C$ filter has the advantage of eliminating the tradeoff between noise and settling. For an amplifier in feedback the output noise power is proportional to the closed loop bandwidth. This is in conflict with the settling error, which is inverse proportional to the closed loop bandwidth. Hence noise performance is typically determined by the settling requirements of the delta-sigma feedback DAC and input sampler. As the $g_m/C$ integrator is open loop and its output is processed by a comparator, there is no settling and linearity requirement. In consequence, low bandwidth can be implemented for superior noise filtering. The bandwidth for the $g_m/C$ integrator is given by $1/(2 \cdot T_{DEM})$.

Figure 4:
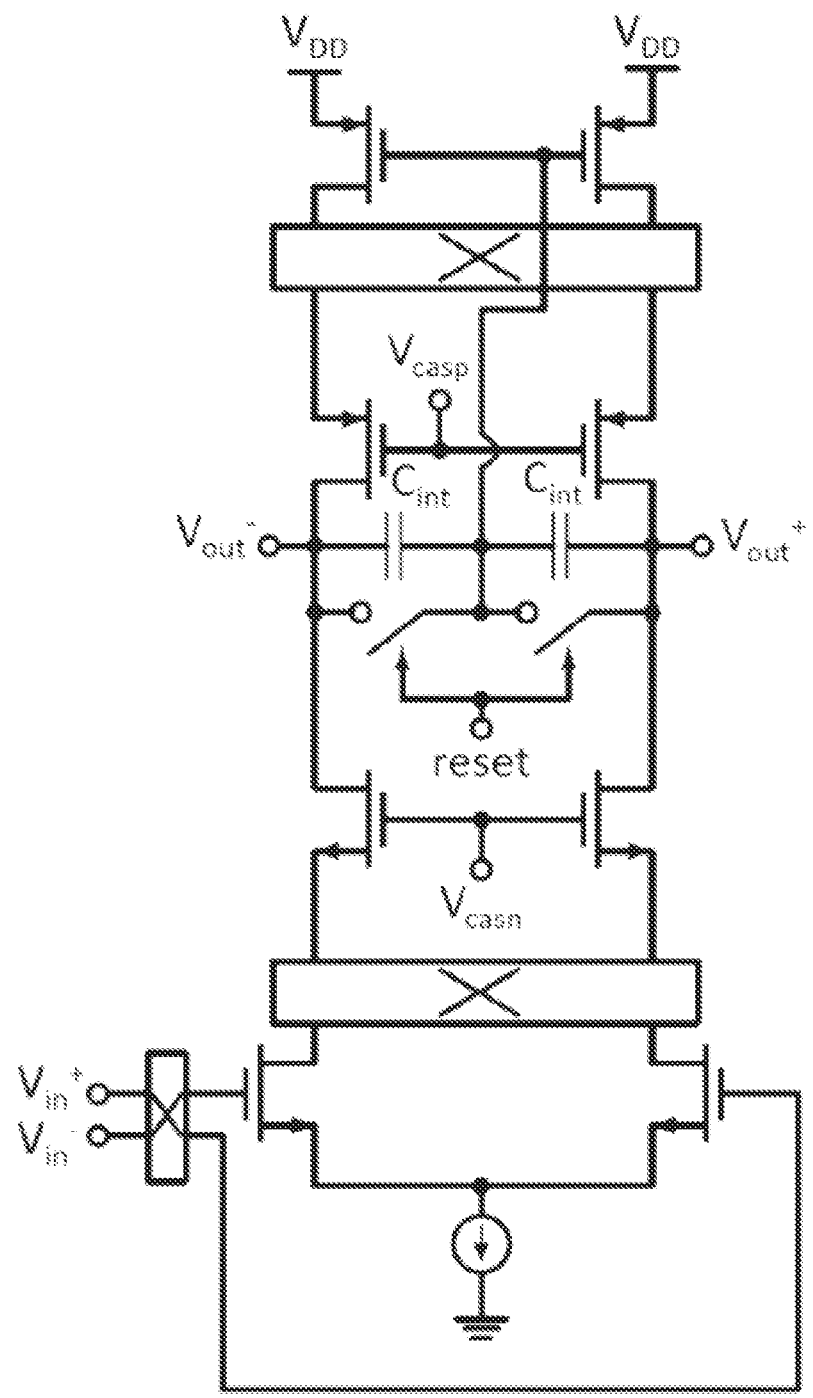
FIG. 4 is a circuit diagram of a $g_m/C$ filter with cascode.

The $g_m/C$ integrator can be implemented with a fully differential cascode amplifier and capacitive load $C_{int}$ as shown in FIG. 4. The integration capacitance $C_{int}$ must be reset between the different SAR cycles to eliminate the previous history. Due to the periodic reset, it also serves as switch capacitor common mode feedback. Although each reset gives rise to charge injection and kT/C noise, it is suppressed by the signal gain $2 \cdot g_m \cdot T_{DEM}/C_{int}$.

Figure 5:
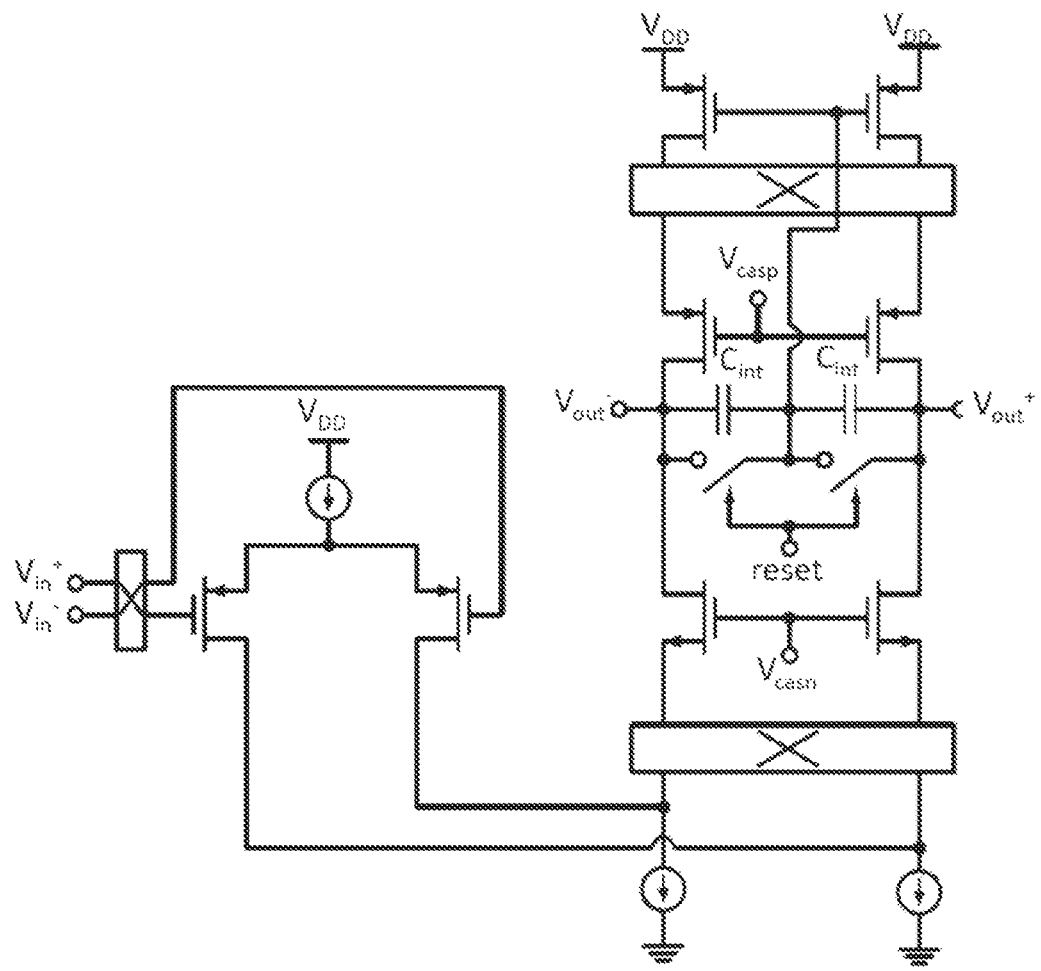
FIG. 5 is a circuit diagram of a $g_m/C$ filter with folded cascode.

Despite the fact that the mismatch waveforms are cancelled towards the end of the DEM cycle, they can before cause large voltage swing at the output (FIG. 3). Depending on matching parameters and supply voltage, a folded cascode amplifier can be used to accommodate this swing, as shown in FIG. 5. If this is not sufficient, the integration capacitance is optionally increased. As the signal gain is thus reduced, an auto zero preamplifier may favourably be employed between the $g_m/C$ output and the comparator input in order to enable auto zeroing during the reset phases.

The DEM switching is illustrated in Tables 1 and 2. The CTAT amplifier and $g_m/C$ stage are chopped. The current mirrors can either be chopped (Table 1) or rotated (Table 2).

TABLE 1

DEM switching type 1, double chopping of current sources.

| DEM cycle | n$_1$ | n$_2$ | n$_3$ | n$_4$ | chop$_1$ | chop$_2$ |
|---|---|---|---|---|---|---|
| 1 | M$_1$ | M$_2$ | M$_3$ | M$_4$ | 0 | 0 |
| 2 | M$_2$ | M$_1$ | M$_4$ | M$_3$ | 0 | 0 |
| 3 | M$_3$ | M$_4$ | M$_1$ | M$_2$ | 1 | 1 |
| 4 | M$_4$ | M$_3$ | M$_2$ | M$_1$ | 1 | 1 |

TABLE 2

DEM switching type 2 (rotation of current sources).

| DEM cycle | n1 | n2 | n3 | n4 | chop1 | chop2 |
|---|---|---|---|---|---|---|
| 1 | M1 | M2 | M3 | M4 | 0 | 0 |
| 2 | M4 | M1 | M2 | M3 | 0 | 0 |
| 3 | M3 | M4 | M1 | M2 | 1 | 1 |
| 4 | M2 | M3 | M4 | M1 | 1 | 1 |

If the bipolar transistors are expected to experience significant flicker noise and drift, they also require DEM. Direct chopping of the bipolar transistors bip$_1$, bip$_2$ is avoided, because switches would be required that would introduce voltage drops much in excess of the required resolution of less than 15 PV.

Figure 6:
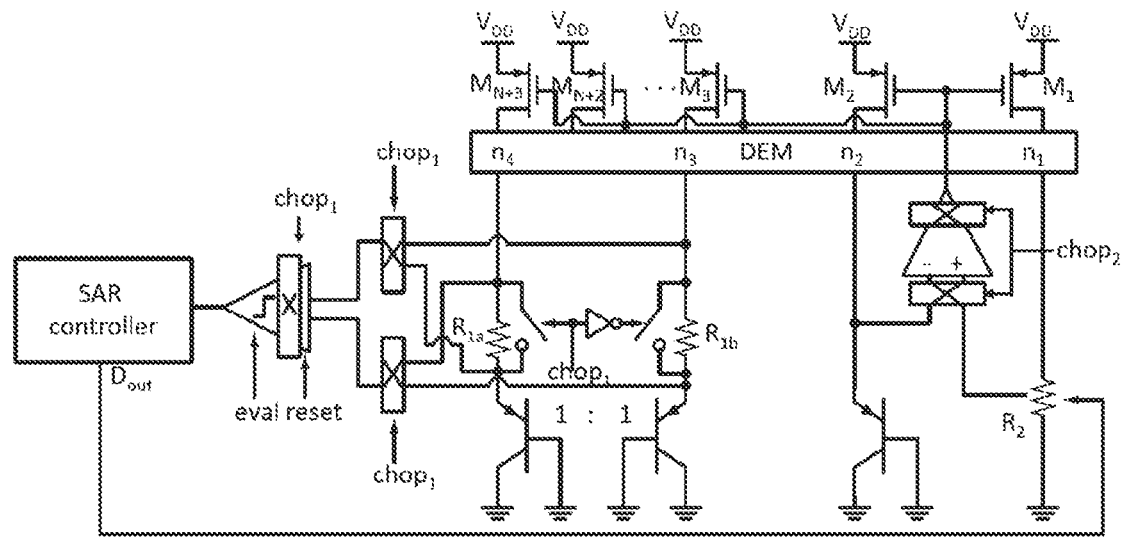
FIG. 6 is a circuit diagram of a direct SAR temperature sensor topology with extended DEM for bipolar chopping.

A circuit according to FIG. 6 can favourably be applied. In this circuit PTAT resistors $R_{1a}$, $R_{1b}$ are implemented on both sides, and the arrangement is symmetric with bipolar transistors of equal size. Asymmetry is introduced by asymmetrical biasing, which is provided by the current mirror DEM controller (Table 3).

TABLE 3

Extended DEM switching for N = 3.

| DEM cycle | n$_1$ | n$_2$ | n$_3$ | n$_4$ | chop$_1$ | chop$_2$ |
|---|---|---|---|---|---|---|
| 1 | M$_1$ | M$_2$ | M$_3$ | M$_4$, M$_5$, M$_6$ | 0 | 0 |
| 2 | M$_6$ | M$_1$ | M$_2$ | M$_3$, M$_4$, M$_5$ | 0 | 0 |
| 3 | M$_5$ | M$_6$ | M$_1$ | M$_2$, M$_3$, M$_4$ | 0 | 0 |
| 4 | M$_5$ | M$_4$ | M$_1$, M$_2$, M$_3$ | M$_6$ | 1 | 1 |
| 5 | M$_4$ | M$_3$ | M$_6$, M$_1$, M$_2$ | M$_5$ | 1 | 1 |
| 6 | M$_3$ | M$_2$ | M$_5$, M$_6$, M$_1$ | M$_4$ | 1 | 1 |

During the first half of the DEM cycle, the left bipolar transistor is biased with higher current, and $R_{1b}$ is connected to the $g_m/C$ filter via Kelvin switches. $R_{1a}$ is shorted to keep the voltage swings at the drain of the PMOS current sources approximately equal. During the second half of the DEM cycle, the switching is reversed, and the right bipolar transistor is biased with higher current. Such an operation effectively chops the bipolar transistors along with the resistors $R_{1a}$ and $R_{1b}$.

Figure 7:
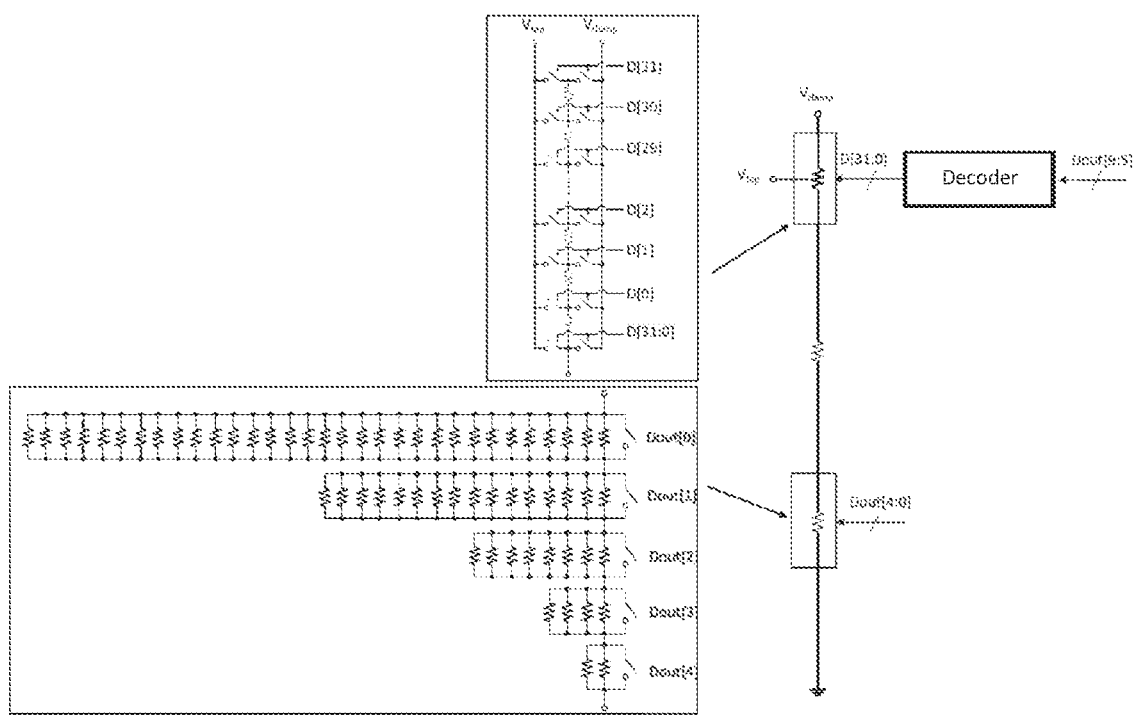
FIG. 7 is a circuit diagram of a resistor DAC.

The resistor DAC $R_2$ is depicted in FIG. 7. Ten bits are needed for a resolution of 0.1K in a 100 K range. In order to implement these bits efficiently with precise matching, five MSBs and five LSBs are implemented separately. For the MSBs a ladder of unit resistors with Kelvin connections is employed. This allows to choose all resistor values corresponding to the five MSBs without introducing any voltage drops across switches. Implementing the ladder down to the LSBs would require very small unit resistors with poor matching. Hence the LSB values are implemented by switching MSB sized unit resistors in parallel. Switches are required to implement all LSB values in this way. The LSBs are connected at the bottom of $R_2$, because low on-resistance can easily be achieved with switching at ground level.

The readout temperature depends on the resistor ratio $R_1/R_{lsb}$ and the absolute value of $V_{ctat}$, according to the above equation for $T_{readout}$. $R_{lsb}=R_{unit}/32$ with $R_{unit}$ denoting the unit resistor in the DAC shown in FIG. 7. It is the minimum resistor step switchable by the DAC, which is controlled by the DAC LSB input D(0). A variation of $R_1/R_{lsb}$ can be taken account of by a correction factor $c_{cal1}$. $V_{ctat}$ typically exhibits a PTAT spread, and the real value for $V_{ctat}$ can be assumed to be $V_{ctat,nominal}-c\cdot T$. The value of $V_{ctat}/V_{ptat}$ becomes $(V_{ctat,nominal}-cT)/V_{ptat}=V_{ctat,nominal}/V_{ptat}-c_{off}$. The PTAT error in $V_{ctat}$ can be compensated with a calibration constant $c_{cal2}$ to cancel $c_{off}$. The corrected readout temperature thus obtained is $T_{readout}=A/[1+(D_{out}\cdot R_{lsb})/(\alpha\cdot R_1\cdot(1+c_{cal1}))+c_{cal2}]+B$.

A two-step calibration on a temperature stabilized wafer chuck can be performed to extract both parameters. During the first step, a known external voltage $V_{ext}$ is applied instead of $V_{ctat}$ as illustrated in FIG. 1 for calibration equal to one. Alternatively, an internal voltage can be applied and measured. The value of the voltage is arbitrary as long as it is known. The nominal ratio $V_{ctat}/V_{ptat}$ for the external voltage at the wafer chuck temperature can be determined from simulation or characterization. A SAR conversion with this calibration is performed, and $V_{ctat}/V_{ptat}$ is compared to the nominal value from simulation or chip characterization: $V_{ctat}/V_{ptat}=(D_{out}\cdot R_{lsb})/[R_1\cdot(1+c_{cal1})]=D_{out,nom}\cdot R_{lsb}/R_1$. Hence $c_{cal1}=D_{out}/D_{out,nom}$. After extraction of $c_{cal1}$, the PTAT error in $V_{ctat}$ can be extracted by performing a conversion in normal mode (internal $V_{ctat}$, calibration equal to zero) at the wafer chuck temperature $T_{chuck}$, which yields the value of $c_{cal2}$ as $c_{cal2}=A/(T_{chuck}-B)-1-(D_{out}\cdot R_{lsb})/[\alpha\cdot R_1\cdot(1+c_{cal1})]$.

The described topology places the analog front end into a SAR loop, so that front end and ADC are combined. This topology is compatible with an accurate bipolar front end and dynamic element matching. Voltage comparison is directly performed on $V_{ptat}$. Dynamic element matching is enabled by employing a $g_m/C$ filter in front of the SAR comparator.

An advantage of the described temperature sensor is faster conversion using a SAR feedback loop and elimination of active circuits such as PTAT generation amplifier and delta-sigma integrators. A further advantage is a tolerance to mismatch and drift.

The invention claimed is:

1. A temperature sensor semiconductor device comprising:
a first diode and a second diode of specified sizing or biasing ratio;
a negative voltage supply;
a first resistor for a proportional to absolute temperature (PTAT) voltage drop, wherein the first diode is connected between the negative supply voltage and the first resistor;
an array of dynamically matched current sources employing a dynamic element matching controller,
wherein the first resistor is connected between the first diode and a first input of the array of dynamically matched current sources, and
wherein the second diode is connected between the negative supply voltage and a second input of the array of dynamically matched current sources; and
a successive approximation register (SAR) feedback loop configured to drive a voltage difference to zero, wherein the voltage difference occurs between a first node present between the first resistor and the first input of the array of dynamically matched current sources and a second node present between the second diode and the second input of the array of dynamically matched current sources,
wherein the SAR feedback loop comprises a SAR controller, a SAR comparator, a generator for a complementary to absolute temperature (CTAT) voltage, and an adjustable second resistor, which implements a SAR digital-to-analog converter and is configured to convert the CTAT voltage into a proportional current, and
wherein the generator for the CTAT voltage is connected to the array of dynamically matched current sources to define a nominal current thereby closing the SAR feedback loop.

2. The temperature sensor semiconductor device of claim 1, wherein the diodes are base-emitter junctions of bipolar transistors.

3. The temperature sensor semiconductor device of claim 1, further comprising a chopped or auto-zeroed integrating preamplifier in front of the SAR comparator configured to convert a step signal into a linear slope signal thereby averaging out DEM transients while amplifying the PTAT voltage.

4. The temperature sensor semiconductor device of claim 3, wherein the integrating preamplifier is configured to employ an open loop transconductance/capacitance stage.

5. The temperature sensor semiconductor device of claim 4, wherein the transconductance/capacitance stage comprises a cascode or a folded cascode.

6. The temperature sensor semiconductor device of claim 3, further comprising a chopping amplifier in the generator for the CTAT voltage.

7. The temperature sensor semiconductor device of claim 1, further comprising:
a further first resistor, the further first resistor being connected between the second diode and the second input of the array of dynamically matched current sources,
wherein the first diode and the second diode are equally sized and thus forming a symmetric arrangement, and
wherein the array of dynamically matched current sources are configured to provide an asymmetrical biasing.

8. The temperature sensor semiconductor device of claim 7,
wherein, during a first half of a DEM cycle, the first diode is biased with a current that is higher than a current of the second diode, the first resistor being shorted and the further first resistor being connected to the SAR feedback loop, and
wherein, during a second half of the DEM cycle, the second diode is biased with a current that is higher than a current of the first diode, the first resistor being connected to the SAR feedback loop and the further first resistor being shorted.

9. The temperature sensor semiconductor device of claim 1, wherein the second resistor comprises a ladder of unit resistors with Kelvin connections and a plurality of unit resistors in parallel.

10. The temperature sensor semiconductor device of claim 1, further comprising a switch of the generator for the CTAT voltage, wherein the switch is configured to enable an application of a calibration voltage of a prescribed value instead of the generated CTAT voltage.

11. The temperature sensor semiconductor device of claim 10,
wherein a SAR conversion with an application of the calibration voltage at a prescribed temperature is configured to yield a correction of a spread in a ratio $R_{lsb}/R_1$ of a resistance of the SAR digital-to-analog converter to the first resistor, and wherein a subsequent SAR conversion at the prescribed temperature without application of the calibration voltage is configured to yield a correction of a PTAT spread of the CTAT voltage.

12. A portable smart home device comprising:
the temperature sensor semiconductor device of claim 1.

13. A connected smart home device comprising:
the temperature sensor semiconductor device of claim 1.

14. A mobile device comprising:
the temperature sensor semiconductor device of claim 1.

15. A medical device comprising:
the temperature sensor semiconductor device of claim 1.

16. A temperature sensor semiconductor device comprising:
- a first diode and a second diode of specified sizing or biasing ratio;
- a negative supply voltage;
- a first resistor provided for a proportional to absolute temperature (PTAT) voltage drop, wherein the first diode is connected between the negative supply voltage and the first resistor;
- an array of dynamically matched current sources employing a dynamic element matching controller,
- wherein the first resistor is connected between the first diode and a first input of the array of dynamically matched current sources, and
- wherein the second diode is connected between the negative supply voltage and a second input of the array of dynamically matched current sources; and
- a successive approximation register (SAR) feedback loop configured to drive a voltage difference to zero, wherein the voltage difference occurs between a first node present between the first resistor and the first input of the array of dynamically matched current sources and a second node present between the second diode and the second input of the array of dynamically matched current sources.

17. A temperature sensor semiconductor device comprising:
- a first diode and a second diode of specified sizing or biasing ratio;
- a negative supply voltage;
- a first resistor provided for a proportional to absolute temperature (PTAT) voltage drop, wherein the first diode is connected between the negative supply voltage and the first resistor;
- an array of dynamically matched current sources employing a dynamic element matching controller,
- wherein the first resistor is connected between the first diode and a first input of the array of dynamically matched current sources, and
- wherein the second diode is connected between the negative supply voltage and a second input of the array of dynamically matched current sources; and
- a successive approximation register (SAR) feedback loop comprising a SAR controller, a SAR comparator, a generator for a complementary to absolute temperature (CTAT) voltage and an adjustable second resistor, which implements a SAR digital-to-analog converter and is configured to convert the CTAT voltage into a proportional current,
- wherein the generator for the CTAT voltage is connected to the array of dynamically matched current sources to define a nominal current thereby closing the SAR feedback loop.

* * * * *